(12) United States Patent
Mason et al.

(10) Patent No.: US 6,345,989 B1
(45) Date of Patent: *Feb. 12, 2002

(54) CIRCUIT BOARD SIDE INTERCONNECT

(75) Inventors: Jeffery W. Mason, North Attleboro; William Petrocelli, Douglas, both of MA (US)

(73) Assignee: Thomas & Betts International, Inc., Sparks, NV (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/477,102

(22) Filed: Jan. 4, 2000

Related U.S. Application Data

(60) Provisional application No. 60/114,997, filed on Jan. 6, 1999.

(51) Int. Cl.$^7$ .......................... H01R 12/00; H05K 1/00
(52) U.S. Cl. ........................................... 439/74; 439/65
(58) Field of Search ............................ 439/55, 61, 66, 439/65, 74

(56) References Cited

U.S. PATENT DOCUMENTS

| | | | | |
|---|---|---|---|---|
| 3,398,232 A | * | 8/1968 | Hoffman | 206/254 |
| 3,634,807 A | * | 1/1972 | Grobe et al. | 439/66 |
| 4,037,898 A | * | 7/1977 | Guyette | 439/82 |
| 4,044,888 A | * | 8/1977 | Schachter | 206/717 |
| 5,044,963 A | * | 9/1991 | Kukkonen et al. | 439/55 |
| 5,051,099 A | * | 9/1991 | Pickles et al. | 439/108 |
| 5,270,903 A | * | 12/1993 | McMichen et al. | 361/760 |
| 5,473,510 A | * | 12/1995 | Dozier, II | 361/719 |
| 5,509,203 A | * | 4/1996 | Yamashita | 29/879 |
| 5,624,268 A | * | 4/1997 | Maeda et al. | 439/66 |
| 5,629,839 A | * | 5/1997 | Woychik | 439/55 |
| 5,761,050 A | * | 6/1998 | Archer | 361/791 |
| 5,819,401 A | * | 10/1998 | Johannes et al. | 29/830 |
| 5,999,097 A | * | 12/1999 | Liddle et al. | 439/55 |
| 6,042,390 A | * | 3/2000 | Leung | 439/74 |

FOREIGN PATENT DOCUMENTS

| | | | |
|---|---|---|---|
| EP | 0 582 881 A1 | 7/1993 | H01G/1/147 |
| WO | WO 97 49130 | 12/1997 | H01L/23/498 |

* cited by examiner

Primary Examiner—Brian Sircus
Assistant Examiner—Hae Moon Hyeon
(74) Attorney, Agent, or Firm—Weingarten, Schurgin, Gagnebin & Lebovici LLP

(57) ABSTRACT

The circuit traces of a circuit board extend to and usually outward from a side surface of the board for direct connection to contacts of a mating connector, circuit board or device. The contact portions of the traces are the end surfaces of the traces which in one embodiment extend outward of the plane of the associated side surface of the circuit board. The contact portion may be of greater cross-sectional area than that of the associated trace to provide a contact area of intended size. The contact portion of a trace may be plated with gold or other appropriate conductive material to enhance conductivity and prevent or minimize oxidation or corrosion. Interconnection to the contact portions of the traces is provided by mating contacts which respectively engage the contact and surfaces of the traces. Preferably, the mating contacts are resilient conductive columns or elements which are maintained in engagement with the contact ends by suitable hardware.

20 Claims, 6 Drawing Sheets

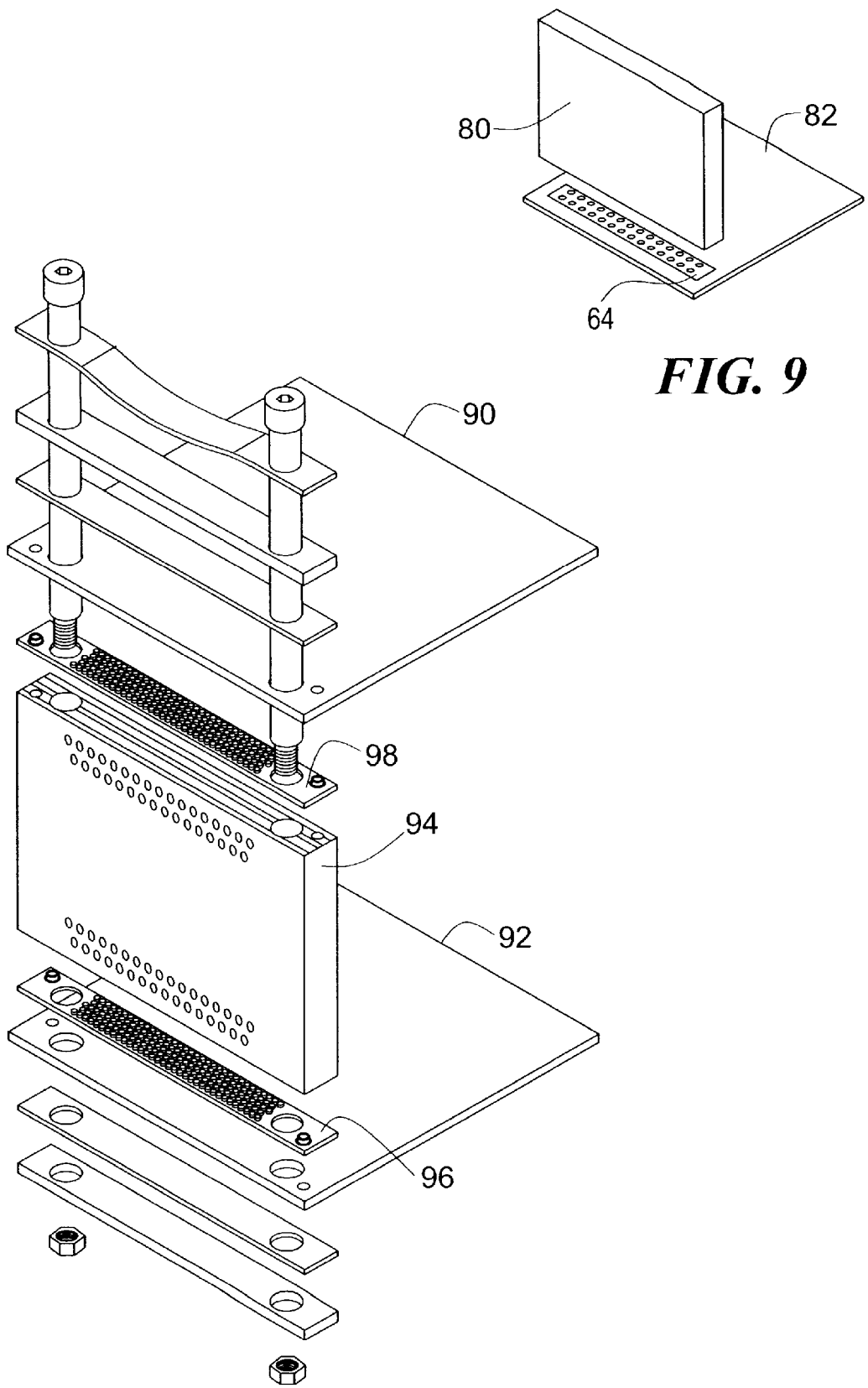

CIRCUIT BOARD SIDE INTERCONNECT

CROSS REFERENCE TO RELATED APPLICATIONS

This application claims priority under 35 U.S.C. §119(e) to provisional patent application Ser. No. 60/114,997, filed Jan. 6, 1999, the disclosure of which is hereby incorporated by reference.

STATEMENT REGARDING FEDERALLY SPONSORED RESEARCH OR DEVELOPMENT

Not Applicable

BACKGROUND OF THE INVENTION

Electronic equipment often employs a circuit board or interconnection panel such as a backplane, and to which one or more circuit boards, often called daughter boards, are connected. The daughter boards are disposed perpendicular to the backplane and are connected thereto by mating connectors. The connector on the daughter board is typically an edge card connector which is disposed along one edge of the board and which provides electrical interconnection from contact pads on a surface of the board to connector contacts in the edge card connector. This connector is mateable to a complementary connector mounted on the backplane. The edge card connectors are separately manufactured components which add to the cost and bulk of a board assembly. For many purposes the distance between an array of daughter boards which may be mounted on a backplane is limited by the physical size of the connectors. As electronic devices operate at ever increasing frequencies, it becomes increasingly important to minimize the length of interconnecting paths on circuit boards containing the electronic components and in electronic assemblies composed of interconnected boards. The use of board connectors adds to the electrical path length and can thereby limit the speed of the board assembly.

In conventional printed circuit boards conductive traces are provided on one or more layers of insulating material and conductive traces of inner layers are interconnected to the conductive traces of other inner layers or surface layers by conductive vias which extend between layers at selected positions. Selected traces are connected to a pad or plated hole located on the top and/or bottom of the circuit board and connectors are attached along the edge of the board and mated to the corresponding pads or holes. Signals must travel along the traces in the circuit board and travel outside the circuit board through the mating connectors.

The edge card connectors can be of the saddle mount type in which a connector body has a slot into which an edge of the circuit board is disposed, or of the right angled type in which the connector body is mounted to a surface of the board near an edge of the circuit board. The electrical path lengths of these conventional board interconnection arrangements are increased by the interconnection paths through the connectors.

BRIEF SUMMARY OF THE INVENTION

In the present invention the circuit traces of a circuit board extend to and usually outward from a side surface of the board for direct connection to contacts of a mating connector, circuit board or device. The traces can also extend to multiple side surfaces of the circuit board. The contact portions of the traces are the end surfaces of the traces which in one embodiment extend outward of the plane of the associated side surface of the circuit board. Alternatively the traces may extend to a plane inward of the plane of the associated side surface of the circuit board or to the plane of the side surface. The contact portion may be of greater cross-sectional area than that of the associated trace to provide a contact area of intended size. The contact portion of a trace may be plated with gold or other appropriate conductive material to enhance conductivity and prevent or minimize oxidation or corrosion. Contact pads may be deposited on or attached to the contact ends of the traces.

Interconnection to the contact portions of the traces is provided by mating contacts which respectively engage the contact end surfaces of the traces. Preferably, the mating contacts are resilient conductive columns or elements which are maintained in engagement with the contact ends by suitable hardware.

The speed of a circuit board constructed in accordance with the invention is improved since signal path lengths can be minimized by the in-line interconnection of board traces to a mating circuit board or device. Spacing between adjacent boards can also be reduced by the absence of bulky connectors. The absence of board connectors also permits high I/O "pin counts" since the contact portions of the traces can be more closely spaced than conventional contact pads.

BRIEF DESCRIPTION OF THE SEVERAL VIEWS OF THE DRAWING

The invention will be more fully understood from the following detailed description taken in conjunction with the accompanying drawings in which:

FIG. 8 is an enlarged side view of an alternate embodiment of FIG. 3a;

FIG. 9 is a pictorial view of a circuit board in accordance with the invention and a mating backplane; and FIG. 10 is an exploded pictorial view of the invention as employed for board to board interconnection.

DETAILED DESCRIPTION OF THE INVENTION

Figure 1:
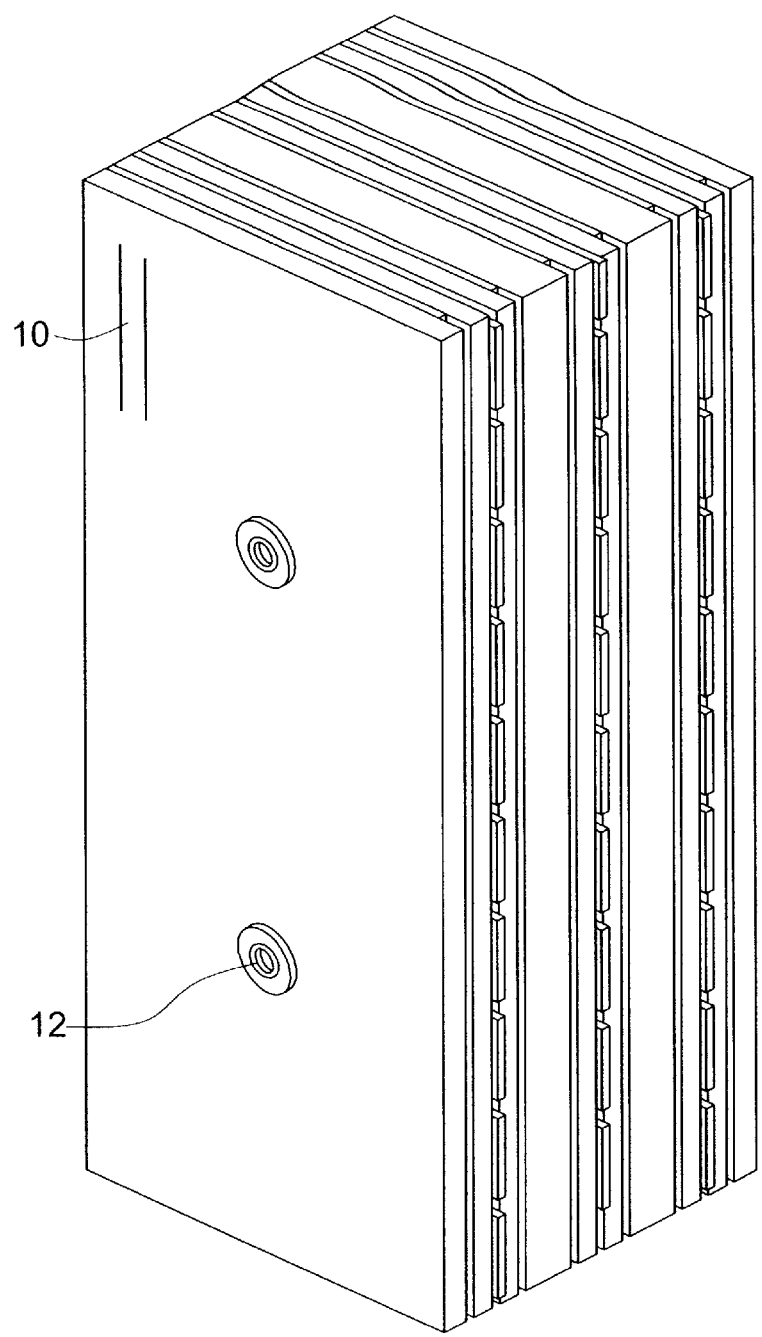
FIG. 1 is a pictorial view of the interconnect in accordance with the invention.
Figure 1A:
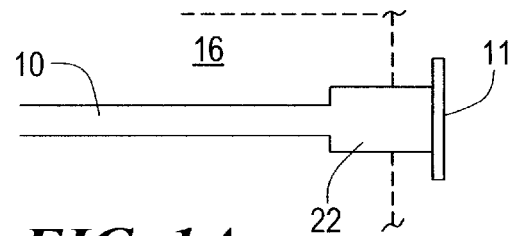
FIG. 1A is an enlarged top view of an contact end only as shown in FIG. 2 having a contact pad thereon.
Figure 2:
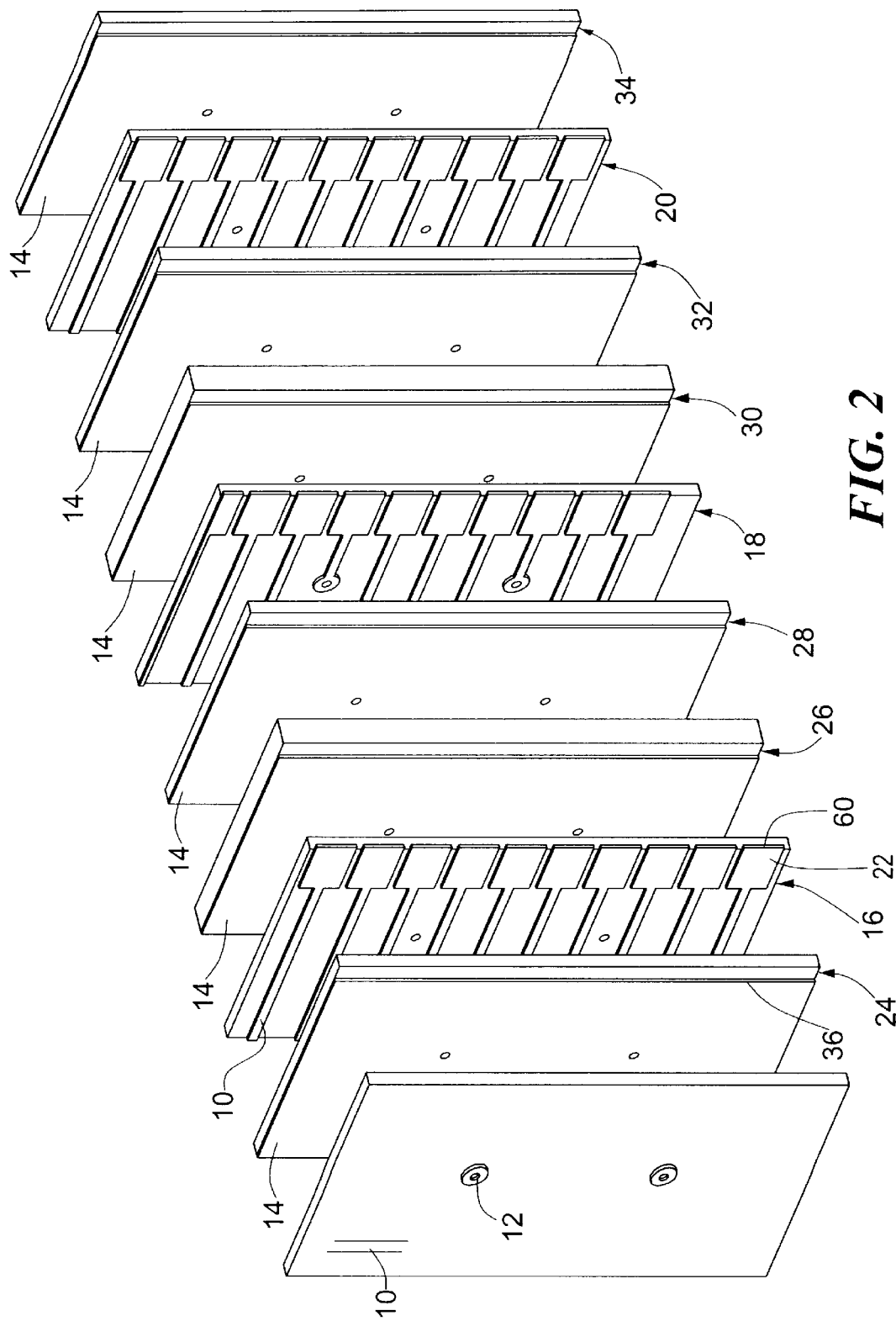
FIG. 2 is a exploded view of the embodiment of FIG. 1.

Referring to FIGS. 1 and 2 there is shown a multilayer circuit board constructed in accordance with the invention. Circuit traces 10 are provided on layers of the board and some of which may be connected to others layers via plated through holes 12. Ground planes 14 may be provided on layers adjacent to signal layers to provide a shielded structure. The multilayer circuit board structure is itself known and can take a variety of well known forms and configurations. In accordance with the invention circuit traces 10 on selected layers of the board extend to a side surface of the board for direct connection to contacts of a mating connector, circuit board or other device. As seen in FIG. 2, the traces 10 on layers 16, 18 and 20 terminate in enlarged contacts 22 which extend beyond the plane of the side of the circuit board by a small amount, typically 0.001 inch. The contact 22 in the illustrated embodiment are of greater cross-sectional area than that of the associated traces to provide an intended contact end 60. The contact may be plated with gold or plated or coated with other appropriate conductive material to enhance contact performance by improving conductivity or preventing or minimizing oxidation or corrosion of the and contact. Contact pads 11 can be attached or provided on the contact 22 as shown in FIG. 1A. These pads may be of copper, conductive epoxy or other conductive material and may be deposited on or attached to the respective ends of the traces.

It is emphasized that the contact areas of the circuit board are only the end areas of 60 the associated traces, such as contacts 22 which are generally orthogonal to the plane of the circuit board. The surfaces of the traces which terminate in contacts 22, which are coplanar with the plane of the circuit board are not employed to contact a mating connector.

Ground planes can be provided on selected board layers to provide shielding. As seen in FIG. 2 a ground plane 14 is provided on a surface of layers 24 and 26 on respective sides of signal layer 16. Ground planes are also provided on layers 28 and 30 on respective sides of layer 18, and ground planes are provided on layers 32 and 34 on respective sides of layer 20. Various other shielding arrangements can be provided as well known in the art. The ground plane extends to an edge 36 on each layer which is inward the outer edge or side of the circuit board from which the contacts 22 extend. The recessed ground plane edges prevent shorting by contacts mating with the ends 22. The ground plane is recessed by a small amount, typically 15 thousands of an inch.

Figure 3:
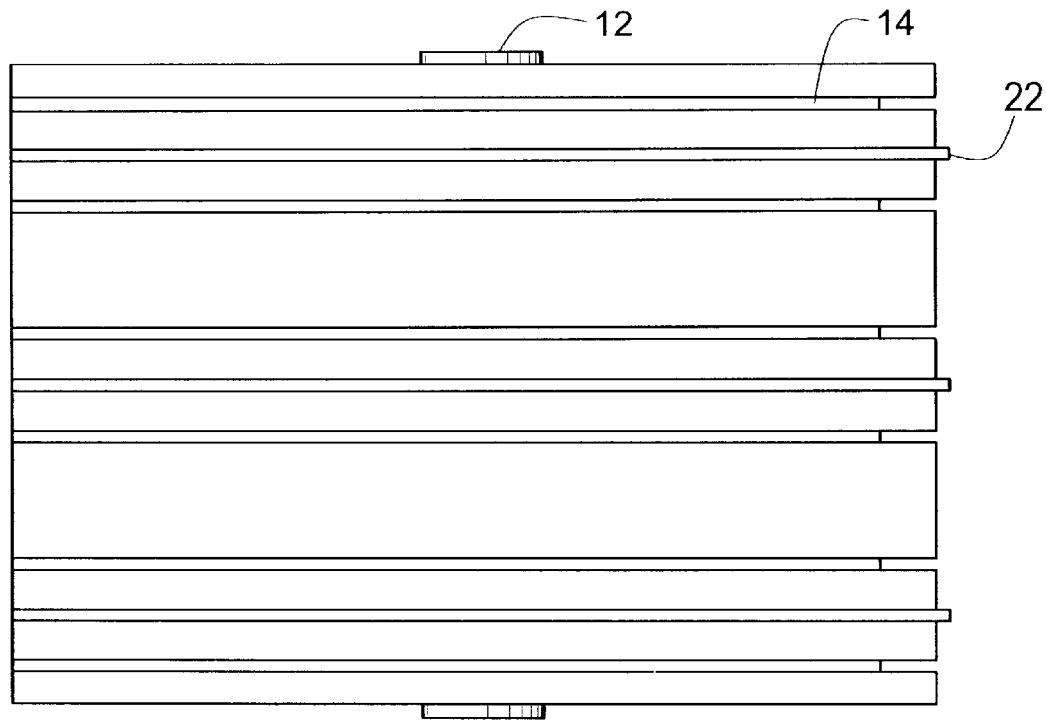
FIG. 3 is an enlarged side view of the invention.
Figure 3A:
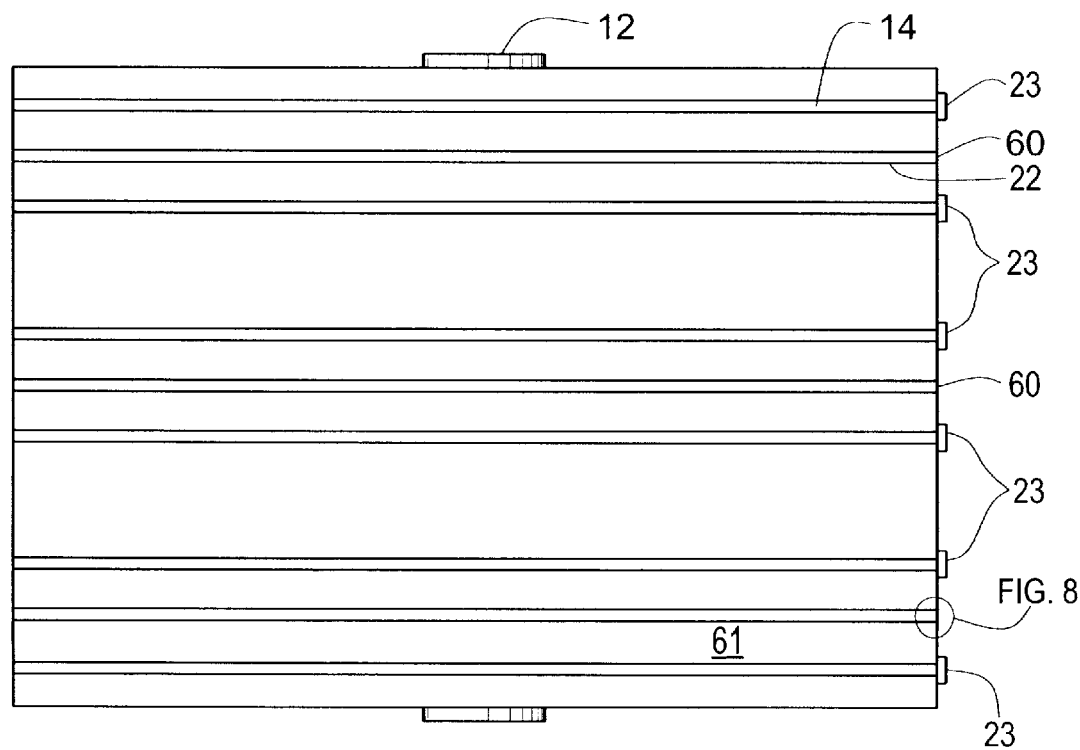
FIG. 3a is an enlarged side view of the invention showing alternate ground plane ends and contact areas.

Alternatively; as shown in FIG. 3a the ground plane can extend to the outer side of the circuit board and with the exposed edge of the ground plane insulated with an appropriate coating 23 to prevent short circuiting of mating contacts.

Figure 4:
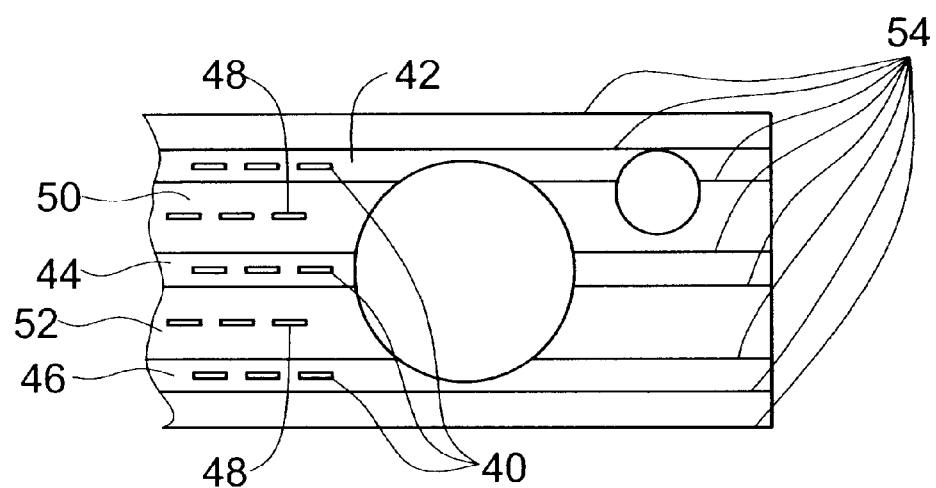
FIG. 4 is an enlarged end view of an interconnect in accordance with the invention.

A greatly enlarged edge or end view of a multilayer circuit board is shown in FIG. 4 A row of signal contacts 40 are provided in alternate layers 42, 44 and 46. A row of ground contacts 48 are provided in layers 50 and 52 which are adjacent the associated signal layers. Ground planes 54 are provided on surfaces of the layers as illustrated such that the signal contacts and associated signal traces are shielded by outer ground planes. The ground planes are selectively connected to the ground contacts 48 for connection to a ground terminal of equipment to which the circuit board is connected.

In a typical multilayer board, the overall board thickness can vary from about 0.062 to 0.125 inch. For an eleven layer board, a typical thickness is about 0.125 inch.

Figure 5:
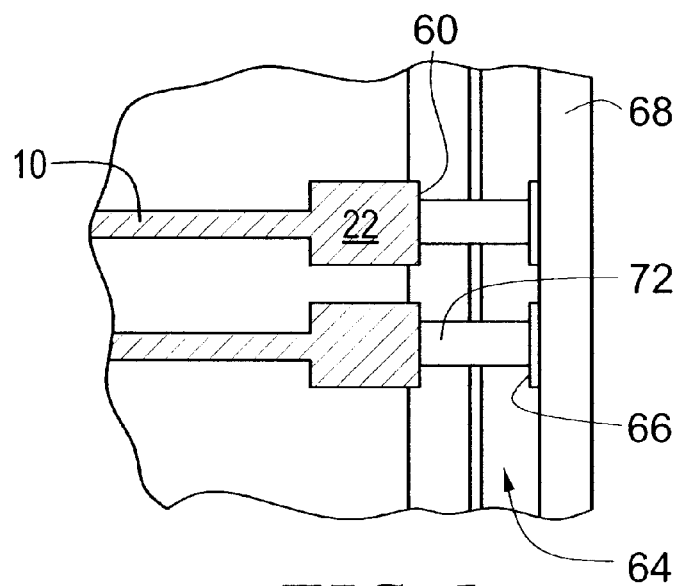
FIG. 5 is an enlarged cutaway view of an interconnect according to the invention and mating contact assembly.

Interconnection to the contact end 60 is provided by mating contacts which respectively engage the contact ends 60 of the side of the board. The mating contacts are preferably resilient conductive columns having contact ends which are maintained in engagement with the contact ends 60 of the board. Referring to FIG. 5, there is shown a cutaway enlarged view of contact ends 60 engaging the contacts of the resilient columns 62 of a contact assembly 64. The opposite contacts of the resilient columns are in engagement with respective contact areas 66 of a circuit board 68.

Figure 6:
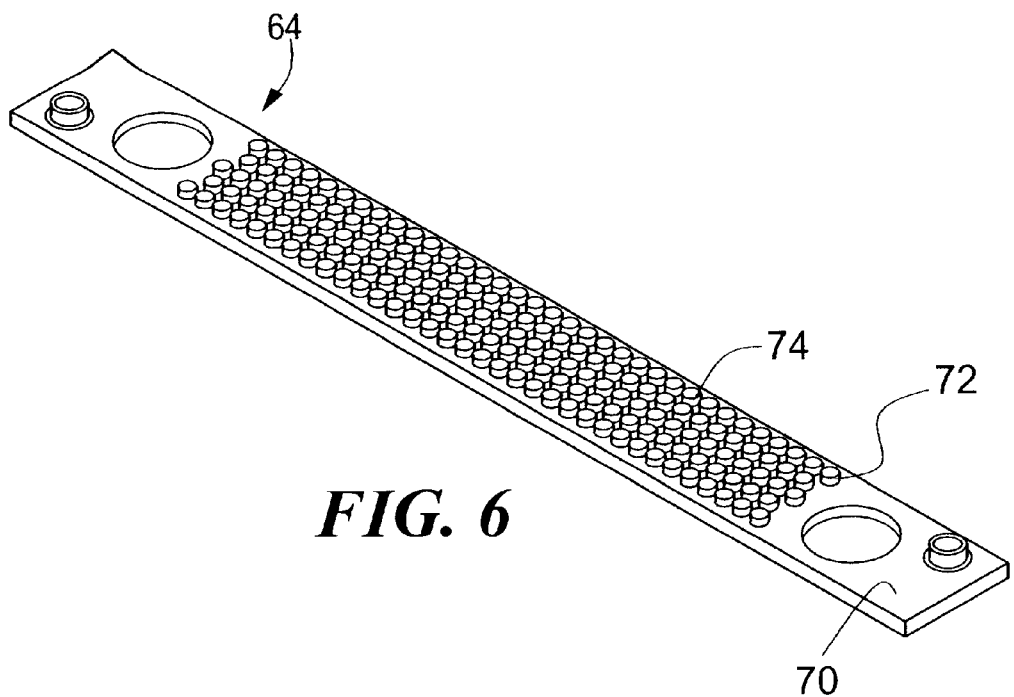
FIG. 6 is a pictorial view of a contact assembly useful with the invention.
Figure 7:
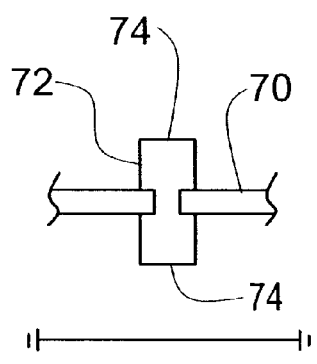
FIG. 7 is an enlarged side view of a resilient conductive column employed in the contact assembly of FIG. 6.

Referring to FIG. 6 a contact assembly is shown which includes a thin supporting sheet 70 of insulating material having a plurality of resilient conductive columns 72 supported in openings provided in sheet 70. The columns 72 each have respective contact ends 74. The columns are fabricated in one embodiment of conductive elastomeric material and have a central section of reduced cross-section for retaining the columns in the mounting openings of sheet 70, as shown in enlarged form in FIG. 7.

The columns are preferably of oval configuration, having a longer axis along the axis of a row of contact ends to be engaged. The oval configuration provides an enhanced contact area with the contact ends 60 of the circuit board. Other contact configurations can be employed to suit particular requirements or specifications.

Figure 8:
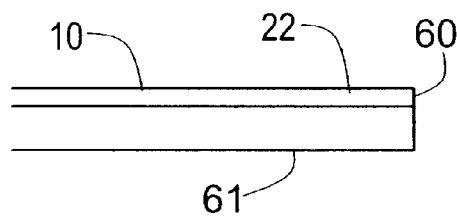

In an alternative embodiment, as shown in FIG. 3a the contacts 22 are supported on a substrate material 61 which typically is the material which constitutes a circuit board layer, as shown enlarged in FIG. 8.

The side interconnect in accordance with the invention is particularly useful in providing interconnection between daughter circuit boards and a backplane such as widely used in the computer and telecommunications industries. For such an interconnection, the contact assembly of conductive resilient elements is interposed between the contact side of a circuit board and mating contacts of a backplane, as illustrated in FIG. 9. Interconnection is provided between the side contacts of the daughter circuit board(s) 80 and corresponding contacts of the backplane 82. A plurality of such daughter circuit boards can be arranged in parallel disposition on a common backplane. The daughter circuit board can be maintained in engagement with the contact assembly and backplane by suitable retention hardware.

The invention also finds application in a board to board interconnection as shown in FIG. 10. A printed circuit board 90 is interconnected to a spaced circuit board 92 by an interconnecting circuit board 94 having side interconnects as described above. A pair of resilient conductive contact assemblies 96 and 98 are provided at respective sides of interconnect board 94 to achieve resilient compressive interconnection between the contact ends of board 94 and respective contacts of circuit boards 90 and 92.

The retention hardware can include elements for maintaining the alignment of the contact ends of the circuit board and the conductive columns of the contact assembly end mating contacts of a backplane or other interconnection device. The contact assembly can itself have alignment elements to maintain proper contact alignment.

The invention is not to be limited by what has been particularly shown and described as alternatives may occur to those of skill in the art without departing from the spirit and true scope of the invention as set forth in the claims.

We claim:

1. A printed circuit board interconnect comprising:
   a printed circuit board having a front surface, a rear surface, at least one side surface between the front surface and the rear surface, and a plurality of conductive traces disposed in the circuit board;
   at least some of the conductive traces extending to the at least one side surface; and
   each of the traces extending to the side surface terminating in a contact end having a contact area substantially in the plane of the side surface, said contact area being mateable to a cooperative contact of a mating unit.

2. The circuit board interconnect of claim 1 wherein each of the contact ends of the traces has a cross-sectional area greater than that of the associated trace.

3. The circuit board interconnect of claim 1 wherein each of the contact ends of the traces is wider than the width of the associated trace.

4. The circuit board interconnect of claim 1 wherein the contact ends of the traces are each coated with a conductive material.

5. The circuit board interconnect of claim 4 wherein the coating is gold.

6. The circuit board interconnect of claim 4 wherein the coating is a noble metal.

7. The circuit board interconnect of claim 1 wherein the printed circuit board is a multilayer printed circuit board including a signal plane and a first ground plane on one side of the signal plane and a second ground plane on the opposite side of the signal plane;

and wherein the signal plane has traces extending to the side surface of the circuit board;

and wherein the ground planes extend to a plane inward of the side surface.

8. The circuit board interconnect of claim 1 wherein the contact ends of the traces are plated.

9. The circuit board interconnect of claim 1 wherein the printed circuit board includes multiple layers.

10. The circuit board interconnect of claim 1 wherein the printed circuit board is a multilayer board having signal traces and ground traces and selected plated through holes for providing intended interconnection of traces on selected layers.

11. The circuit board interconnect of claim 10 wherein the printed circuit board includes at least one ground plane having an edge which extends toward the side surface having the contact ends; and wherein the ground plane is electrically isolated from the contact ends.

12. The circuit board interconnect of claim 11 wherein the ground plane edge is disposed inward of said side surface.

13. The circuit board interconnect of claim 11 wherein the ground plane extends to said side surface and has an insulated coating on the edge thereof.

14. The circuit board interconnect of claim 1 further including a contact assembly comprising:

a plurality of resilient conductive elements each having respective conductive ends the ends on one side of the contact assembly being engageable with respective contact areas of the traces; and an insulative thin supporting sheet having mounting openings in said sheet wherein said resilient conductive elements are supported in respective mounting openings.

15. A printed circuit board interconnect comprising:

a printed circuit board having a front surface, a rear surface, at least one side surface between the front surface and the rear surface, and a plurality of conductive traces disposed in the circuit board;

at least some of the conductive traces extending outward from the side surface by a predetermined amount and terminating in a contact end substantially parallel with the plane of the side surface and being mateable to a cooperative contact of a mating unit.

16. The circuit board interconnect of claim 1 wherein the contact areas of the traces are generally orthogonal to the top surface of the circuit board.

17. The circuit board interconnect of claim 1 including a contact pad in conductive engagement with each contact area of respective traces.

18. A printed circuit board interconnect comprising:

a multi-layer printed circuit board having a front surface, a rear surface, at least one side surface between the front surface and the rear surface, and a plurality of conductive traces disposed on at least one inner layer of the circuit board; and at least some of the inner-layer conductive traces extending to the at least one side surface and terminating in a contact end having a contact area substantiality parallel to or in the plane of the side surface, said contact area being mateable to a cooperative contact of a mating unit.

19. The printed circuit board interconnect of claim 18 further comprising a contact assembly comprising:

a plurality of resilient conductive elements each having respective conductive ends, the ends on one side of the contact assembly being engageable with respective contact areas of the traces;

an insulative thin supporting sheet having mounting openings in said sheet wherein said resilient conductive elements are supported in respective mounting openings; and said contact assembly interposed between a contact side of a circuit board and said contact areas.

20. The printed circuit board interconnect of claim 19 wherein said contact assembly and said circuit board are maintained in engagement by a retaining mechanism.

\* \* \* \* \*

UNITED STATES PATENT AND TRADEMARK OFFICE
CERTIFICATE OF CORRECTION

PATENT NO.      : 6,345,989 B1  
DATED           : February 12, 2002  
INVENTOR(S)     : Jeffery W. Mason et al.

It is certified that error appears in the above-identified patent and that said Letters Patent is hereby corrected as shown below:

<u>Title page,</u>
Item [57], ABSTRACT,
Line 14, "and" should read -- end --;

<u>Column 3,</u>
Line 14, "and" should read -- end --;
Line 20, "of 60" should read -- 60 of --;
Line 38, ";" should be -- , --;
Line 58, "end" should read -- ends --; and <u>Column 4,</u>
Line 45, "end" should read -- and --.

Signed and Sealed this

Nineteenth Day of November, 2002

*Attest:*

JAMES E. ROGAN
*Director of the United States Patent and Trademark Office*

*Attesting Officer*